United States Patent
Ishibashi et al.

(10) Patent No.: US 10,112,501 B2
(45) Date of Patent: Oct. 30, 2018

(54) POWER STORAGE DEVICE, POWER STORAGE SYSTEM, AND ELECTRIC VEHICLE

(71) Applicant: SONY CORPORATION, Tokyo (JP)

(72) Inventors: Yoshihito Ishibashi, Tokyo (JP); Kazuo Nagai, Kanagawa (JP); Rui Kamada, Tokyo (JP); Junichi Sawada, Tokyo (JP); Kazuhiro Toma, Kanagawa (JP)

(73) Assignee: SONY CORPORATION, Minato-Ku, Tokyo (JP)

( * ) Notice: Subject to any disclaimer, the term of this patent is extended or adjusted under 35 U.S.C. 154(b) by 390 days.

(21) Appl. No.: 14/779,723

(22) PCT Filed: Jan. 16, 2014

(86) PCT No.: PCT/JP2014/000177
§ 371 (c)(1),
(2) Date: Sep. 24, 2015

(87) PCT Pub. No.: WO2014/162645
PCT Pub. Date: Oct. 9, 2014

(65) Prior Publication Data
US 2016/0059730 A1    Mar. 3, 2016

(30) Foreign Application Priority Data
Apr. 1, 2013  (JP) .................................. 2013-076175

(51) Int. Cl.
*B60L 11/18* (2006.01)
*H01M 10/44* (2006.01)
(Continued)

(52) U.S. Cl.
CPC ............. *B60L 11/1868* (2013.01); *B60L 1/06* (2013.01); *B60L 3/12* (2013.01); *B60L 7/12* (2013.01);
(Continued)

(58) Field of Classification Search
CPC .. Y02T 10/7216; Y02T 10/92; B60L 11/1851; B60L 2210/12; B60L 1/00;
(Continued)

(56) References Cited

U.S. PATENT DOCUMENTS 9,559,539 B2 * 1/2017 Goto ..................... A47J 31/005
2004/0263347 A1    12/2004 Yasui et al.
(Continued)

FOREIGN PATENT DOCUMENTS

CN        101416330 A     4/2009
CN        102161319 A     8/2011
(Continued)

OTHER PUBLICATIONS

International Search Report issued in connection with International Patent Application No. PCT/JP2014/000177, dated Apr. 2, 2014. (2 pages).

(Continued)

*Primary Examiner* — Ryan Johnson
(74) *Attorney, Agent, or Firm* — K&L Gates LLP

(57) ABSTRACT

A power storage device includes a power storage unit including one or a plurality of cells, a first controller for performing control relating to the power storage unit, a first power line for supplying a first power to be output from the power storage unit to a load, a second power line for supplying a second power smaller than the first power to a second controller included in an external device, and a communication line used by the first and second controllers to communicate with each other.

12 Claims, 12 Drawing Sheets

(51) Int. Cl.
| | | |
|---|---|---|
| *G06F 1/32* | (2006.01) | |
| *B60L 1/06* | (2006.01) | |
| *B60L 3/12* | (2006.01) | |
| *B60L 7/12* | (2006.01) | |
| *B60L 7/14* | (2006.01) | |
| *B60L 11/12* | (2006.01) | |
| *B60L 15/20* | (2006.01) | |
| *H01M 10/0525* | (2010.01) | |
| *H01M 10/42* | (2006.01) | |
| *G01R 31/36* | (2006.01) | |
| *H02J 1/06* | (2006.01) | |
| *H02J 7/00* | (2006.01) | |

(52) U.S. Cl.
CPC ............... *B60L 7/14* (2013.01); *B60L 11/126* (2013.01); *B60L 11/1803* (2013.01); *B60L 11/1805* (2013.01); *B60L 11/1816* (2013.01); *B60L 11/1846* (2013.01); *B60L 11/1851* (2013.01); *B60L 11/1853* (2013.01); *B60L 11/1855* (2013.01); *B60L 11/1861* (2013.01); *B60L 11/1866* (2013.01); *B60L 11/1874* (2013.01); *B60L 11/1875* (2013.01); *B60L 11/1879* (2013.01); *B60L 15/2009* (2013.01); *G06F 1/32* (2013.01); *H01M 10/0525* (2013.01); *H01M 10/4257* (2013.01); *H01M 10/44* (2013.01); *H02J 7/0068* (2013.01); *B60L 2210/12* (2013.01); *B60L 2210/40* (2013.01); *B60L 2240/12* (2013.01); *B60L 2240/421* (2013.01); *B60L 2240/441* (2013.01); *B60L 2240/547* (2013.01); *B60L 2240/549* (2013.01); *B60L 2250/16* (2013.01); *G01R 31/3606* (2013.01); *H01M 2010/4271* (2013.01); *H01M 2220/20* (2013.01); *H02J 1/06* (2013.01); *H02J 7/0063* (2013.01); *Y02T 10/6217* (2013.01); *Y02T 10/645* (2013.01); *Y02T 10/7005* (2013.01); *Y02T 10/7044* (2013.01); *Y02T 10/7061* (2013.01); *Y02T 10/7066* (2013.01); *Y02T 10/7072* (2013.01); *Y02T 10/7077* (2013.01); *Y02T 10/7216* (2013.01); *Y02T 10/7241* (2013.01); *Y02T 10/7275* (2013.01); *Y02T 10/92* (2013.01); *Y02T 90/121* (2013.01); *Y02T 90/127* (2013.01); *Y02T 90/128* (2013.01); *Y02T 90/14* (2013.01); *Y02T 90/16* (2013.01); *Y02T 90/163* (2013.01); *Y02T 90/169* (2013.01); *Y04S 30/14* (2013.01)

(58) Field of Classification Search
CPC .. H01M 10/44; H01M 10/4257; H02J 7/0032; G06F 1/32
See application file for complete search history.

(56) References Cited

U.S. PATENT DOCUMENTS

| | | |
|---|---|---|
| 2005/0077878 A1 | 4/2005 | Carrier et al. |
| 2007/0210757 A1 | 9/2007 | Gangstoe et al. |
| 2010/0244782 A1 | 9/2010 | Nagayama et al. |
| 2011/0202220 A1 | 8/2011 | Seta et al. |
| 2012/0176097 A1 | 7/2012 | Takezawa et al. |
| 2013/0066519 A1* | 3/2013 | Yoshikawa ............... B60L 1/00 701/36 |
| 2013/0249446 A1 | 9/2013 | Kumagai |
| 2014/0203634 A1* | 7/2014 | Sugiyama ................ B60L 1/00 307/10.1 |

FOREIGN PATENT DOCUMENTS

| | | |
|---|---|---|
| CN | 103229386 A | 7/2013 |
| JP | 2003-235155 | 8/2003 |
| JP | 2007-520180 | 7/2007 |
| JP | 2007-520180 A | 7/2007 |
| JP | 2009-529849 | 8/2009 |
| JP | 2009-529849 A | 8/2009 |
| JP | 2012-227986 | 11/2012 |
| JP | 2012-227986 A | 11/2012 |
| JP | 2013-013184 | 1/2013 |
| JP | 2013-013184 A | 1/2013 |
| WO | 2012/077412 A1 | 6/2012 |
| WO | 2013/035176 A1 | 3/2013 |

OTHER PUBLICATIONS

Extended European Search Report dated Nov. 10, 2016 in corresponding European application No. 14779506.6 (9 pages).

Office Action and search report for related Chinese Application No. 201480018077X; dated May 27, 2017.

Japanese Office Action dated Oct. 3, 2017 for corresponding Japanese application No. 2015-509870 (related to above-captioned patent application).

* cited by examiner

POWER STORAGE DEVICE, POWER STORAGE SYSTEM, AND ELECTRIC VEHICLE

CROSS REFERENCES TO RELATED APPLICATIONS

The present application is a national stage of International Application No. PCT/JP2014/000177 filed on Jan. 16, 2014 and claims priority to Japanese Patent Application No. 2013-076175 filed on Apr. 1, 2013, the disclosure of which is incorporated herein by reference.

BACKGROUND

The present disclosure relates to a power storage device, a power storage system, and an electric vehicle.

A power storage device which supplies power to a device having a load such as a motor has been widely used (for example, refer to Patent Literature 1 below). The device (external device), to which the power from the power storage device is supplied, normally includes a controller (external controller).

CITATION LIST

Patent Document

Patent Literature 1: JP 2003-235155 A

SUMMARY

Problems to be Solved by the Invention

According to a technique described in Patent Literature 1, it is necessary to include a battery to operate the external controller. In order to dispense with the battery like this, it is desirable that the external controller provided in the external device be operated by the power to be supplied from the power storage device.

Therefore, one of purposes of the present disclosure is to provide a power storage device, a power storage system, and an electric vehicle in which an external controller provided in an external device is operated by the power to be supplied from the power storage device.

Solutions to Problems

To solve the above-mentioned problem, for example, the present disclosure is a power storage device including a power storage unit configured to include one or a plurality of cells, a first controller configured to perform control relating to the power storage unit, a first power line configured to supply a first power output from the power storage unit to a load, a second power line configured to supply a second power smaller than the first power to a second controller included in an external device, and a communication line configured to be used by the first controller and the second controller to communicate with each other.

For example, the present disclosure is a power storage system including a first device and a second device. The first device includes a power storage unit which includes one or a plurality of cells, a first controller which performs control relating to the power storage unit, a first power line which supplies a first power output from the power storage unit to a load, a second power line which supplies a second power smaller than the first power to the second controller, and a communication line which is use by the first and second controllers to communicate with each other. The second device includes the load to which the first power is supplied via the first power line and the second controller to which the second power is supplied via the second power line and which communicates with the first controller via the communication line.

For example, the present disclosure is an electric vehicle including a power storage device which includes a power storage unit configured to include one or a plurality of cells, a first controller configured to perform control relating to the power storage unit, a first power line configured to supply a first power output from the power storage unit to a load, a second power line configured to supply a second power smaller than the first power to a second controller included in an external device, and a communication line configured to be used by the first controller and the second controller to communicate with each other.

Effects of the Invention

According to at least one embodiment, the external controller provided in the external device is operated by the power to be supplied from the power storage device. The effect of this specification is an example, and the content of the present disclosure is not narrowly interpreted according to the exemplified effect.

Additional features and advantages are described herein, and will be apparent from the following Detailed Description and the figures.

DETAILED DESCRIPTION

Embodiments of the present disclosure will be described below with reference to the drawings. The description will be in the following order.

<1. First Embodiment>
<2. Second Embodiment>
<3. Application>
<4. Modification>

The embodiments to be described below are preferable concrete examples of the present disclosure, and the content of the present disclosure is not limited to these embodiments.

In the following description, the expression "smaller than A" may be understood as "equal to or less than A" and "less than A". The expression "larger than A" may be understood as "equal to or more than A" and "more than A".

1. First Embodiment

Structure of General Power Storage System

Figure 1:
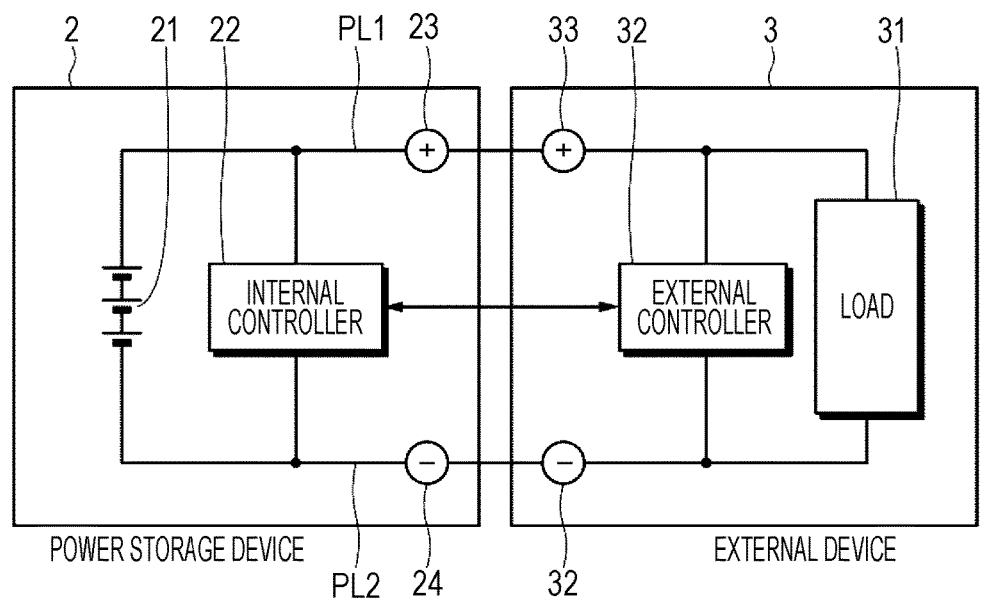
FIG. 1 is a diagram of an exemplary structure of a general power storage system.

First, to easily understand the present disclosure, a structure of a general power storage system is described. In FIG. 1, a structure of a general power storage system 1 is illustrated. The power storage system 1 includes a power storage device 2 and an external device 3 which is connected to the power storage device 2, and the power is supplied from the power storage device 2 to the external device 3.

The power storage device 2 includes a power storage unit 21 including one or a plurality of secondary battery cells (appropriately, referred to as cell) and a controller (appropriately, referred to as internal controller) 22 in the power storage device 2. A positive power line PL1 is connected to a positive side of the power storage unit 21, and a negative power line PL2 is connected to a negative side of the power storage unit 21. The power line PL1 is connected to the external device 3 via a positive electrode terminal 23. The power line PL2 is connected to the external device 3 via a negative electrode terminal 24. The internal controller 22 is operated by using the power output from the power storage unit 21.

The external device 3 includes a load 31 and a controller (appropriately, referred to as external controller) 32 in the external device 3. The external device 3 includes a positive electrode terminal 33 and a negative electrode terminal 34. The external device 3 is connected to the power line PL1 of the power storage device 2 via the positive electrode terminal 33 and connected to the power line PL2 of the power storage device 2 via the negative electrode terminal 34. The external controller 32 communicates with the internal controller 22 based on a predetermined communication standard.

The magnitude of the power consumed by the external device 3 (power consumption) increases in a state where the load is operated. For example, the power consumption of the external device 3 in a state where the load operates is several hundreds W. However, the power consumption of the external device 3 in a state where the operation of the load is stopped and the external controller 32 operates is about several mW to several W. Certainly, the power consumption above is an example, and the magnitude of the power consumption differs according to the load.

A state where the power is supplied to the load of the external device or a state where the external controller performs various processing in that state is appropriately referred to as an active state. On the other hand, a state where the power is not supplied to the load or a state where the external controller performs various processing in that state is appropriately referred to as asleep state. The power consumption of the external device in the active state is larger than that of the external device in the sleep state.

The power storage device 2 cannot recognize whether the external device 3 is in the active state or the sleep state. It is necessary for the power storage device 2 to continue to supply the output of the power storage unit 21 in order to prepare for a case where the state of the external device 3 becomes the active state. Therefore, it is necessary for the internal controller 22 in the power storage device 2 to strictly perform control relating to the power storage unit 21, for example, to prevent an overdischarge, cell balance control, temperature monitoring control, and current monitoring control.

There is a problem in that the power consumption of the internal controller 22 increases and a remaining capacity of the power storage unit 21 decreases by strictly performing the control relating to the power storage unit 21 by the internal controller 22. For example, when the external device 3 is in the sleep state, the power consumption of the external device 3 is small. That is, normally, the remaining capacity of the power storage unit 21 does not rapidly decrease, and it is not necessary to strictly perform the control relating to the power storage unit 21. The present disclosure has been made in consideration of these points. An example of the present disclosure will be described in detail below.

[Example of Secondary Battery]

In the embodiment, an exemplary secondary battery to be used is a lithium ion secondary battery including a positive-electrode active material and a carbon material such as graphite as a negative-electrode active material. A positive electrode material is not especially limited.

However, the positive electrode material preferably includes a positive-electrode active material having an olivine structure.

As the positive-electrode active material having the olivine structure, it is more preferable to use lithium iron phosphate compound ($LiFePO_4$) or lithium iron complex phosphate compound ($LiFe_xM_{1-x}O_4$: M is one or more kinds of metal, and x satisfies $0<x<1$) including exotic atoms. Also, when M is equal to or more than two kinds, M is selected so that the sum total of subscript numbers of the respective kinds becomes "1−x".

Transition element, IIA group element, IIIA group element, IIIB group element, IVB group element, and the like can be exemplified as M. It is especially preferable that M include at least one of cobalt (Co), nickel, manganese (Mn), iron, aluminum, vanadium (V), and titanium (Ti).

Regarding the positive-electrode active material, on the surface of the lithium iron phosphate compound or the lithium iron complex phosphate compound, a coating layer may be coated which includes metal oxide having different composition from that of the above oxide (for example, ones selected from among Ni, Mn, Li, and the like), phosphate compound (for example, lithium phosphate), and the like.

As the positive electrode material which can store and discharge lithium (Li), lithium composite oxide may be used, such as lithium cobaltate ($LiCoO_2$) having a layered rock-salt structure, lithium nickelate ($LiNiO_2$), lithium manganate ($LiMnO_2$), and lithium manganate ($LiMn_2O_4$) having a spinel structure.

The graphite in the present disclosure is not especially limited, and a graphite material which is used in the industry can be widely used. As a material of the negative electrode, lithium titanate, silicon (Si)-based material, tin (Sn)-based material, and the like may be used.

A method for manufacturing the electrode of the electric battery according to the present disclosure is not especially limited, and a method used in the industry can be widely used.

The electric battery structure according to the present disclosure is not especially limited, and a well-known structure can be widely used.

Electrolytic solution used in the present disclosure is not especially limited, and electrolytic solution, which includes liquid and gel-like electrolytic solution, used in the industry can be widely used.

As electrolyte solvent, it is preferable to use 4-fluoro-1,3-dioxolan-2-one (FEC), ethylene carbonate, propylene carbonate, butylene carbonate, vinylene carbonate (VC), dimethyl carbonate, diethyl carbonate, ethyl methyl carbonate, γ-butyrolactone, γ-valerolactone, 1,2-dimethoxyethane, tetrahydrofuran, 2-methyltetrahydrofuran, 1,3-dioxolane, 4-methyl-1,3-dioxolane, methyl acetate, methyl propionate, ethyl propionate, acetonitrile, glutaronitrile, adiponitrile, methoxyacetonitrile, 3-methoxypropionitrile, N,N-dimethylformamide, N-methylpyrrolidone, N-methyloxazolidone, nitromethane, nitroethane, sulfolane, dimethylsulfoxide, trimethyl phosphate, triethyl phosphate, ethylene sulfide, and bis trifluoromethylsulfonyl imide hexyltrimethylammonium. It is more preferable to use 4-fluoro-1,3-dioxolan-2-one (FEC), ethylene carbonate, propylene carbonate, butylene carbonate, vinylene carbonate (VC), dimethyl carbonate, diethyl carbonate, ethyl methyl carbonate, γ-butyrolactone, and γ-valerolactone.

As electrolytic solution supporting salt, it is preferable to use lithium hexafluorophosphate (LiPF$_6$), lithium bis(pentafluoroethanesulfonyl)imide (Li(C$_2$F$_5$SO$_2$)$_2$N) lithium perchlorate (LiClO$_4$), lithium hexafluoroarsenate (LiAsF$_6$), lithium tetrafluoroborate (LiBF$_4$), lithium triflate (LiSO$_3$CF$_3$), lithiumbis(trifluoromethanesulphonyl)imide (Li(CF$_3$SO$_2$)$_2$N), and tris(trifluoromethanesulfonyl)methyllithium (LiC(SO$_2$CF$_3$)$_3$).

The lithium ion secondary battery can be classified into a square type, a cylindrical type, a flat plate type, and the like according to the shape. The shape of the lithium ion secondary battery according to the present disclosure is not especially limited. However, a cylindrical lithium ion secondary battery is used as an example here. A single cylindrical lithium ion secondary battery is appropriately referred to as a cell. An average output voltage of the cell of the lithium ion secondary battery is, for example, about 3.0 V (volt), and a full charge voltage is, for example, about 4.2V. Also, a capacity of the cell of the lithium ion secondary battery is, for example, 3 Ah (Ampere hour) (3000 mAh (milli Ampere hour)).

[Structure of Power Storage Device]

Figure 2:
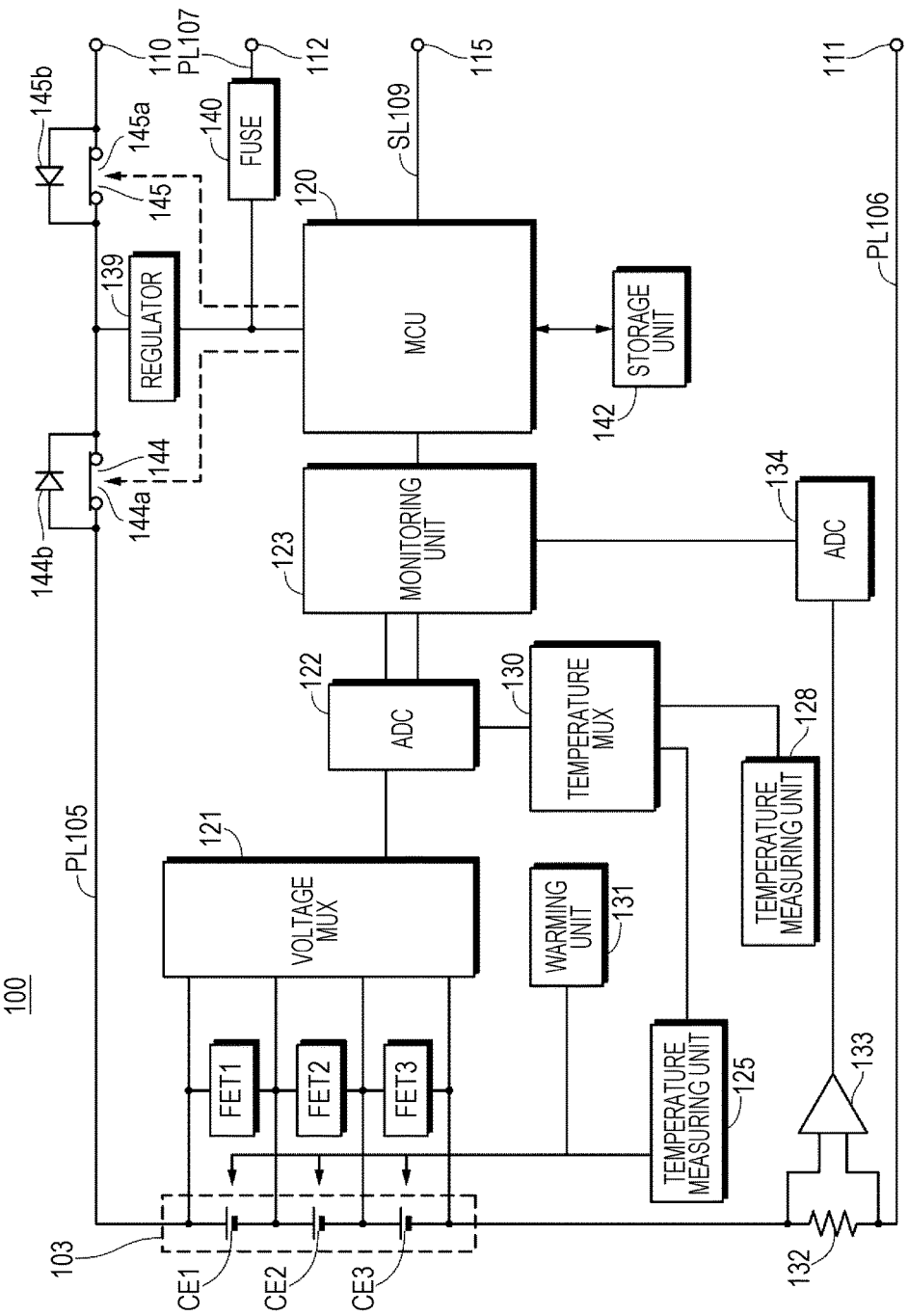
FIG. 2 is a block diagram of an exemplary structure of a power storage device according to a first embodiment.

In FIG. 2, an exemplary structure of the power storage device according to the first embodiment is illustrated. Each part included in a power storage device 100 is, for example, stored in an outer case having a predetermined shape. It is preferable that the outer case use a material having high conductivity and emissivity. Excellent heat radiation performance in the outer case can be obtained by using the material having the high conductivity and emissivity. Increase in the temperature in the outer case can be reduced by obtaining the excellent heat radiation performance. In addition, an opening of the outer case can be minimized or omitted, and high dust-proof and drip-proof can be realized. For the outer case, a material such as aluminum, aluminum alloy, copper, copper alloy, or the like is used. A detaching mechanism and the like according to a use of the power storage device 100 is formed on the outer case of the power storage device 100.

The power storage device 100 includes a power storage unit including one or a plurality of cells. In this example, a power storage unit 103 includes three cells (cells CE1, CE2, and CE3). The cells CE1, CE2, and CE3 are connected in series. Certainly, the number and a connection mode of the cells can be appropriately changed according to the use of the power storage device. For example, the plurality of cells may be connected in parallel. Also, the plurality of cells which is connected in parallel (may be referred to as sub-module) may be connected in series.

A positive power line PL105 is extended from a positive side of the cell CE1. A positive electrode terminal 110 is connected to the power line PL105. A negative power line PL106 is extended from a negative side of the cell CE3. A negative electrode terminal 111 is connected to the power line PL106. Power of the power storage unit 103 (example of first power) is supplied to an external device via the positive power line PL105 and the negative power line PL106. For example, a load of the external device is operated by using the first power.

A power line PL107 is connected to the power line PL105 of the power storage device 100. For example, the power line PL107 is connected to a connection midpoint between a charging controller and a discharging controller, which are to be described, in the power line PL105. A power supply terminal (appropriately referred to as S terminal) 112 is connected to the power line PL107. Power obtained by converting the power of the power storage unit 103 (example of second power) is output from the S terminal 112. For example, an external controller of the external device is operated by using the second power. In the first embodiment, the second power is constantly output from the S terminal 112 in a state where the power storage device 100 is connected to the external device.

A state where the power storage device 100 supplies the first power via the positive electrode terminal 110 and the negative electrode terminal 111 relative to the external device or a state where an MCU to be described below performs predetermined processing in the above state is appropriately referred to as an active state. A state where the power storage device 100 supplies the second power via the S terminal 112 and the negative electrode terminal 111 relative to the external device or a state where the MCU to be described below performs the predetermined processing in the above state is appropriately referred to as a sleep state. The sleep state is an exemplary first state in claims, and the active state is an exemplary second state in claims.

The power storage device 100 has a communication line SL109 used to communicate with the external device. A communication terminal (appropriately referred to as C terminal) 115 is connected to the communication line SL109. A duplex communication via the communication line SL109 based on the predetermined communication standard is performed between the power storage device 100 and the external device. As the predetermined communication standard, a standard such as I2C and system management bus (SMBus) which are standards of the serial communication, serial peripheral interface (SPI) and CAN is exemplified. The wired and wireless communication may be performed. In addition, another communication line may be provided which is different from the communication line used for the communication based on the communication standard described above.

The C terminal 115 is, for example, pulled up in the power storage device 100. When a state of the C terminal 115 is logically low, the power storage device 100 is in the active state. When the state of the C terminal 115 is logically high, the power storage device 100 is in the sleep state. Certainly, it is possible that the power storage device 100 is in the active state when the state of the C terminal 115 is logically high and the power storage device 100 is in the sleep state when the state of the C terminal 115 is logically low. The state of the C terminal 115 is, for example, controlled by the external controller of the external device, and the change is detected by the MCU of the power storage device 100.

The power storage device 100 includes a main control unit (MCU) 120 which is an exemplary internal controller, a voltage multiplexer (MUX) 121, an analog to digital converter (ADC) 122, a monitoring unit 123, temperature measuring units 125 and 128, a temperature multiplexer 130, a warming unit 131, a current detecting resistor 132, a current detecting amplifier 133, an ADC 134, a regulator 139, a fuse 140, a charging controller 144, and a discharging controller 145. In addition, a field effect transistor (FET) is provided corresponding to each cell.

The MCU 120 controls each unit of the power storage device 100. The MCU 120 performs, for example, control relating to the power storage unit 103. As the control relating to the power storage unit 103, control for monitoring the temperature and the voltage of each cell included in the power storage unit 103, a current which flows in the power storage unit 103, and the like, control for securing safety of the power storage device 100 to prevent overcurrent, over discharge, and the like, control for balancing the cells included in the power storage unit 103, and the like are exemplified.

When the power storage device 100 is in the active state, the MCU 120 strictly performs the control relating to the power storage unit 103. Whereas, when the power storage device 100 is in the sleep state, the MCU 120 does not strictly perform the control relating to the power storage unit 103. That is, the MCU 120 omits a part of the control relating to the power storage unit 103 performed in the active state, and a period of processing which is periodically performed is prolonged by the MCU 120. For example, when the power storage device 100 is in the sleep state, the MCU 120 monitors the remaining capacity (state of charge (SOC)) of the power storage unit 103 and the change of the state of the C terminal 115. Therefore, the power consumption of the MCU 120 in the sleep state is smaller than that of the MCU 120 in the active state.

The voltage multiplexer 121 outputs a voltage of each cell detected by a voltage detecting unit (not shown) to the ADC 122. The voltage of each cell is detected at a predetermined period during the charge and discharge. For example, when the power storage device 100 is in the active state, the voltage of each cell is detected by the voltage detecting unit at a period of 250 millisecond (ms). In this example, since the power storage unit 103 includes three cells, three analog voltage data is supplied to the voltage multiplexer 121.

The voltage multiplexer 121 switches a channel at a predetermined period and selects a single analog voltage data from among the three analog voltage data. The single analog voltage data selected by the voltage multiplexer 121 is supplied to the ADC 122. The voltage multiplexer 121 switches the channel and supplies a next analog voltage data to the ADC 122. The switch of the channel by the voltage multiplexer 121 is controlled, for example, by the MCU 120.

The temperature measuring unit 125 detects the temperature of each cell. The temperature measuring unit 125 includes an element to detect the temperature such as a thermistor. For example, the temperature of each cell is detected at the predetermined period during the charge and discharge. The highest temperature from among the three cells may be a temperature to be output from the temperature measuring unit 125, and an average value of the temperatures of the three cells may be a temperature to be output from the temperature measuring unit 125.

An analog temperature data indicating the temperature of each cell detected by the temperature measuring unit 125 is supplied to the temperature multiplexer 130. In this example, since the power storage unit 103 includes three cells, three analog temperature data is supplied to the temperature multiplexer 130.

The temperature multiplexer 130, for example, switches the channel at the predetermined period and selects a single analog temperature data from among the three analog temperature data. The single analog temperature data selected by the temperature multiplexer 130 is supplied to the ADC 122. The temperature multiplexer 130 switches the channel and supplies a next analog temperature data to the ADC 122. The channel is switched by the temperature multiplexer 130, for example, according to the control by the MCU 120.

The temperature measuring unit 128 measures the temperature of a whole power storage device 100. The temperature measuring unit 128 measures the temperature in the outer case of the power storage device 100. The analog temperature data measured by the temperature measuring unit 128 is supplied to the temperature multiplexer 130, and then, the analog temperature data is supplied from the temperature multiplexer 130 to the ADC 122. The ADC 122 converts the analog temperature data into a digital temperature data. The digital temperature data is supplied from the ADC 122 to the monitoring unit 123.

The ADC 122 converts the analog voltage data supplied from the voltage multiplexer 121 into a digital voltage data. The ADC 122 converts the analog voltage data into, for example, a digital voltage data of 14 to 18 bits. As a conversion system by the ADC 122, various methods such as a successively comparing system and a delta sigma ($\Delta\Sigma$) system may be applied.

For example, the ADC 122 includes an input terminal, an output terminal, a control signal input terminal to which a control signal is input, and a clock pulse input terminal to which a clock pulse is input (these terminals are not shown). The analog voltage data is input to the input terminal. The output terminal outputs the converted digital voltage data.

For example, a control signal (control command) supplied from the MCU 120 is input to the control signal input terminal. The control signal is, for example, an acquisition instructing signal which instructs to obtain the analog voltage data supplied from the voltage multiplexer 121. When the acquisition instructing signal is input, the ADC 122 obtains the analog voltage data, and the obtained analog voltage data is converted into the digital voltage data. The digital voltage data is output via the output terminal according to a clock pulse for synchronization to be input to the clock pulse input terminal. The output digital voltage data is supplied to the monitoring unit 123.

In addition, the acquisition instructing signal which instructs to obtain the analog temperature data supplied from the temperature multiplexer 130 is input to the control signal input terminal. The ADC 122 obtains the analog temperature data according to the acquisition instructing signal. The ADC 122 converts the obtained analog temperature data into the digital temperature data. The analog temperature data is converted into, for example, a digital temperature data of 14 to 18 bits. The converted digital temperature data is output via the output terminal, and the output digital temperature data is supplied to the monitoring unit 123. ADCs which respectively perform processing to a voltage data and a temperature data may be separately provided. A function block of the ADC 122 may have a function of a comparator for comparing the voltage and temperature with a predetermined value.

The ADC 122 transmits, for example, time-division multiplexed three digital voltage data and three digital temperature data to the monitoring unit 123. The cell having the voltage and the temperature may be indicated by describing an identifier which identifies each cell in a header of the transmission data.

The current detecting resistor 132 detects values of currents for respectively flowing in the three cells. The current detecting resistor 132 detects an analog current data. For example, the analog current data is detected at a predetermined period during the charge and discharge.

The current detecting amplifier 133 amplifies the detected analog current data. Again of the current detecting amplifier 133 is set to, for example, about 50 to 100 times. The analog current data amplified by the current detecting amplifier 133 is supplied to the ADC 134.

The ADC 134 converts the analog current data supplied from the current detecting amplifier 133 into a digital current data. The ADC 134 converts the analog current data into, for example, a digital current data of 14 to 18 bits. As a conversion system by the ADC 134, various methods such as a successively comparing system and a delta sigma ($\Delta\Sigma$) system can be applied.

For example, the ADC 134 includes an input terminal, an output terminal, a control signal input terminal to which a control signal is input, and a clock pulse input terminal to which a clock pulse is input (these terminals are not shown). The analog current data is input to the input terminal. The output terminal outputs the digital current data.

For example, the control signal (control command) supplied from the MCU 120 is input to the control signal input terminal of the ADC 134. The control signal is, for example, an acquisition instructing signal which instructs to obtain the analog current data supplied from the current detecting amplifier 133. When the acquisition instructing signal is input, the ADC 134 obtains the analog current data, and the obtained analog current data is converted into the digital current data. The digital current data is output from the output terminal according to the clock pulse for synchronization to be input to the clock pulse input terminal. The output digital current data is supplied to the monitoring unit 123. The ADC 122 may be the same as the ADC 134.

The monitoring unit 123 outputs the digital voltage data and the digital temperature data supplied from the ADC 122 to the MCU 120. In addition, the monitoring unit 123 outputs the digital current data supplied from the ADC 134 to the MCU 120. The MCU 120 performs the control relating to the power storage unit 103 based on various data supplied from the monitoring unit 123.

The warming unit 131 appropriately warms the cells. For example, the warming unit 131 includes a resistance wire having a predetermined resistance value and is provided near the cells. In the power storage device 100, the resistance wire is arranged so as to effectively warm the cells, and the current flows in the resistance wire. Accordingly, the cells are warmed. For example, the MCU 120 controls the warming unit 131 (for example, turning on/off the warming unit 131).

The regulator 139 is provided between the power line PL105 and the MCU 120. For example, the regulator 139 is connected to a connection midpoint between the charging controller 144 and the discharging controller 145. For example, the MCU 120 is connected to the connection midpoint between the charging controller 144 and the discharging controller 145 via the regulator 139. The regulator 139 forms an operating voltage (for example, 3.3 V or 5 V) of the MCU 120 from the voltage of the power storage unit 103 and supplies the formed operating voltage to the MCU 120. That is, the MCU 120 is operated by the power of the power storage unit 103.

The S terminal 112 (power line PL107) is connected to an end of the regulator 139 where the power is output. However, the S terminal 112 may be connected to an end of the regulator 139 where the power is input.

The fuse 140 which is an exemplary power conversion unit is provided between the power line PL105 and the S terminal 112 in the power line PL107. The fuse 140 is, for example, formed as a poly-switch. The fuse 140 converts (limit) the power of the power storage unit 103 and forms a second power. The second power is smaller than the power of the power storage unit 103 (first power). The second power is output from the S terminal 112 to the external controller of the external device. When the operating voltage of the MCU 120 is the same as that of the external controller of the external device, it is preferable that the output of the regulator 139 be output from the S terminal 112, and it is not necessary to provide the fuse 140. In addition, the fuse 140 may have other configuration which can convert the power. For example, a small power output type direct current (DC)-DC converter may be used instead of the fuse.

A storage unit 142 includes a read only memory (ROM), a random access memory (RAM), and the like. The storage unit 142 stores, for example, a program to be performed by the MCU 120. In addition, the storage unit 142 is used as a work area in a case where the MCU 120 performs the processing. The storage unit 142 may store histories of the charge and the discharge.

The charging controller 144 includes a charge control switch 144a and a diode 144b. The diode 144b is connected to the charge control switch 144a in parallel and in the forward direction relative to a discharge current. The discharging controller 145 includes a discharge control switch 145a and a diode 145b. The diode 145b is connected to the discharge control switch 145a in parallel and in the forward direction relative to a charge current. For example, an insulated gate bipolar transistor (IGBT) and a metal oxide semiconductor field effect transistor (MOSFET) can be used as the charge control switch 144a and the discharge control switch 145a. The charging controller 144 and the discharging controller 145 may be inserted to a negative power supply line.

For example, the MCU 120 controls on/off of the charge control switch 144a and the discharge control switch 145a. In FIG. 2, a flow of the control signal from the MCU 120 to the charge control switch 144a and the discharge control switch 145a is indicated by dotted arrows.

Three FETs (FET1, FET2, and FET3) are provided between terminals of the respective cells while corresponding to the structure (three cells) of the power storage unit 103. The FET performs, for example, cell balance control of a passive system.

An outline of the cell balance control performed by the FET will be described. For example, it is assumed that the cell CE2 be more deteriorated than the other cells and an internal impedance of the cell CE2 increase. When the power storage device 100 is charged in this state, the cell CE2 is not charged to the normal voltage due to the increase in the internal impedance. Therefore, the balance of the voltages between the respective cells varies.

To eliminate variation in the balance of the voltages between the respective cells, the FET1 and the FET3 are turned on, and the cells CE1 and CE3 are discharged to a predetermined voltage value. The FET1 and the FET3 are turned off after the discharge. The voltages of the respective cells after the discharge becomes, for example, a predetermined value (for example, 3.0 V), and the voltages of the respective cells are balanced. A system of the cell balance control is not limited to the passive system, and a so-called active method and other well-known method can be applied.

The above-mentioned structure of the power storage device is an example. A part of the exemplified structure may be omitted, and a structure which is different from the exemplified structure may be added.

[Operation of Power Storage Device]

Figure 3:
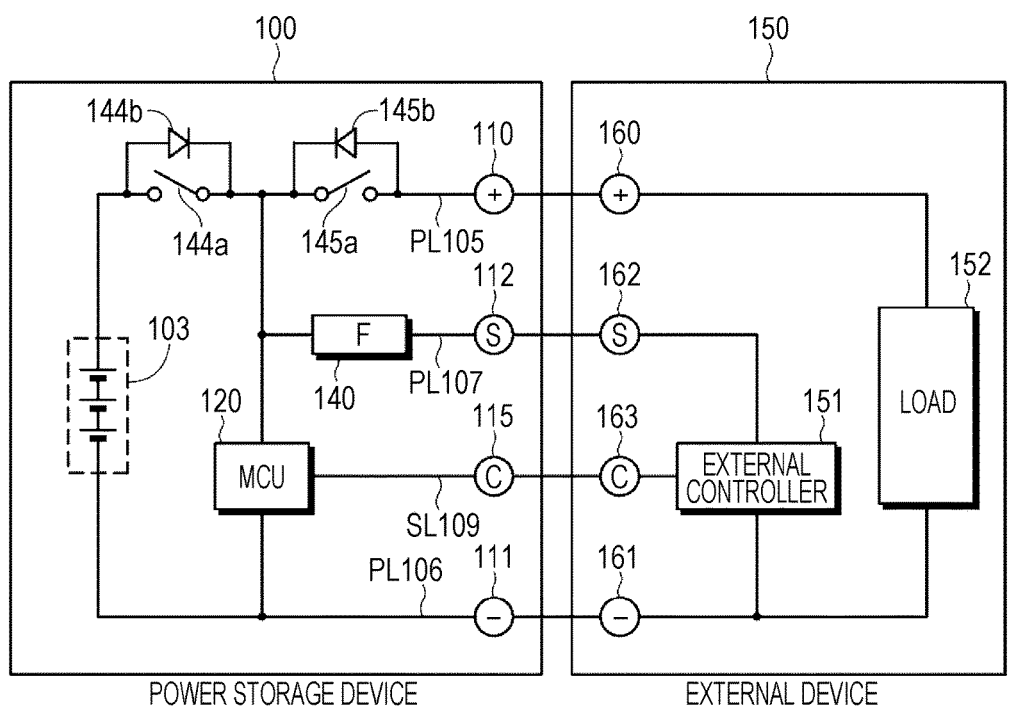
FIG. 3 is a diagram to describe an exemplary operation of the power storage device according to the first embodiment.

An exemplary operation of the power storage device 100 will be described with reference to FIG. 3. Structures of the power storage device and the external device are simplified and illustrated in FIG. 3. As illustrated in FIG. 3, an external device 150 is connected to the power storage device 100. A power storage system 10 is formed by the power storage device 100 and the external device 150. The power storage device 100 may be fixed to the external device 150, and the power storage device 100 may be removable to the external device 150.

The external device 150 has an external controller 151 including a central processing unit (CPU) and the like and a load 152. Corresponding to the structure of the power storage device 100, the external device 150 includes a positive electrode terminal 160, a negative electrode terminal 161, an S terminal 162, and a C terminal 163. The positive electrode terminal 160 is connected to the positive electrode terminal 110 of the power storage device 100. The negative electrode terminal 161 is connected to the negative electrode terminal 111 of the power storage device 100. The S terminal 162 is connected to the S terminal 112 of the power storage device 100. The C terminal 163 is connected to the C terminal 115 of the power storage device 100. In this example, the description will be made as it is assumed that the external device be a compact electric vehicle (EV) (electric automobile) and the load 152 be a motor.

When the compact EV is not used, both of the power storage device 100 and the external device 150 are in the sleep state. The states (level) of the C terminal 115 and the C terminal 163 are high. Since it is not necessary to supply the power to the load 152, the charge control switch 144a and the discharge control switch 145a are turned off. The power of the power storage unit 103 is not supplied to the load 152.

On the other hand, it is necessary to supply the power to the external controller 151. Especially, in recent years, a software switch has been widely used to open/close doors of an automobile and to instruct the automobile to start instead of a physical switch. The software switch is, for example, an input by using a remote control device and an input without using a physical key (for example, an input which can be performed by a person who has a predetermined mobile device). In order to monitor whether the input is made, it is necessary to constantly activate the external controller 151.

When a power supply to activate the external controller 151 is provided separately from the power storage device 100, it is necessary to perform control such as to secure the safety relative to the power supply. Accordingly, this is inefficient. Therefore, the external controller 151 is operated by using the power of the power storage unit 103.

The power from the power storage unit 103 is supplied to the fuse (abbreviated as F in the FIG. 140 via the diode 144b. The fuse 140 forms the second power. The second power is supplied to the S terminal 112. The power output from the S terminal 112 is supplied to the external controller 151 via the S terminal 162. The external controller 151 is operated based on the power to be supplied. In the sleep state, for example, the external controller 151 monitors whether the instruction to start the compact EV is made. Since the load 152 is not driven, it is not necessary for the external controller 151 to control the load 152.

When the external device 150 is in the sleep state, the load of the processing performed by the external controller 151 is small. Therefore, the power consumption by the external controller 151 is slight. Since the power consumption by the external controller 151 is slight, there is small effect on the remaining capacity and the temperature of the power storage unit 103. Therefore, the MCU 120 monitors the remaining capacity at a period longer than the normal period. Also, a part of the processing (for example, processing such as monitoring the temperature) is not performed. Accordingly, the power consumption of the MCU 120 can be reduced.

Here, it is assumed that a starting instruction to the compact EV be issued. The starting instruction which is an exemplary predetermined input is detected by the external controller 151. The external controller 151 changes its state from the sleep state to the active state, and, for example, performs initialize processing of the external device 150 and checks the system. In addition, the external controller 151 lowers the state of the C terminal 163 to low. Accordingly, the state of the C terminal 115 changes to low.

The MCU 120 detects the change of the state of the C terminal 115. The MCU 120, which has detected that the state of the C terminal 115 has become low, changes its state from the sleep state to the active state and performs the processing according to the active state. The MCU 120 of which the state has changed to the active state performs, for example, processing for turning on at least the discharge control switch 145a (also, processing for turning on the charge control switch 144a may be performed). Accordingly, the power of the power storage unit 103 is supplied to the load 152 via the power lines PL105 and PL106. The external controller 151 performs the control to drive the load 152. The load 152 is driven by the power of the power storage unit 103.

Since the power of the power storage unit 103 is supplied to the load 152, the MCU 120 strictly performs the control relating to the power storage unit 103. For example, the MCU 120 tries to safely operate the power storage device 100 by performing processing for monitoring an amount of the current flowing in the power storage unit 103 and monitoring the voltage and the temperature of each cell and processing to adjust the balance between the cells. Based on the result of the processing, the MCU 120 appropriately turns on/off the charge control switch 144a and the discharge control switch 145a and secures the safety of the power storage device 100. Well-known processing can be applied to the processing for securing the safety of the power storage device 100. For example, when the temperature of the cell is higher than a predetermined value and when the lowest voltage of the cell is lower than a predetermined voltage, the discharge control switch 145a is turned off.

Here, it is assumed that an operation stop instruction to the compact EV be issued. The external controller 151 detects the operation stop instruction. The external controller 151 changes its state from the active state to the sleep state and, for example, stops the drive of the load 152. In addition, the external controller 151 lowers the state of the C terminal 163 to high. Accordingly, the state of the C terminal 115 changes to high. The external controller 151 of which the state is changed to the sleep state monitors, for example, whether the starting instruction is input or not. For example, this monitoring processing is regularly performed.

The MCU 120 detects the change of the state of the C terminal 115. The MCU 120, which has detected that the state of the C terminal 115 has become high, changes its state from the active state to the sleep state and performs the processing according to the sleep state. The MCU 120 of which the state has been changed to the sleep state, for example, turns off the discharge control switch 145a and the charge control switch 144a and monitors the remaining capacity of each cell and the state of the C terminal. Accordingly, the supply of the power of the power storage unit 103 to the load 152 is stopped. However, the power supply to the external controller 151 is continued.

As described above, the external controller can be operated by using the power of the power storage device. In addition, for example, the power consumption of the power storage device and the external device in the sleep state can be reduced by changing the operation of the controller of the power storage device according to the state of the external device.

[Flow of Processing]

Figure 4:
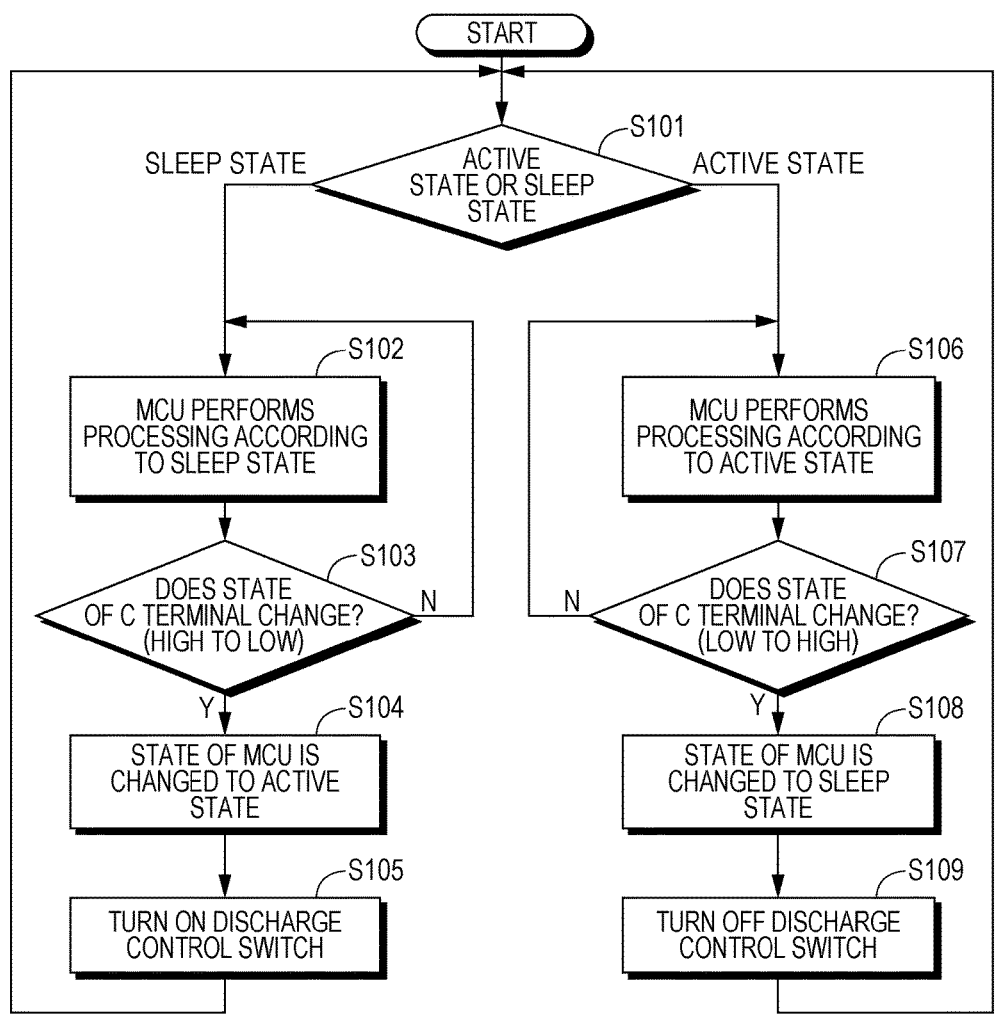
FIG. 4 is a flowchart of an exemplary flow of processing to be performed by a controller in the power storage device according to the first embodiment.

FIG. 4 is a flowchart of an exemplary flow of processing in the power storage device 100. It is determined in step S101 whether the power storage device 100 is in the sleep state or in the active state. In this example, the power storage device 100 is in the sleep state when the state of the C terminal 115 is high, and the power storage device 100 is in the active state when the state of the C terminal 115 is low. When the power storage device 100 is in the sleep state, the processing proceeds to step S102.

In step S102, the MCU 120 performs processing according to the sleep state. For example, the MCU 120 performs processing for monitoring the remaining capacity of each cell included in the power storage unit 103. Certainly, when it is determined that power storage device 100 has an abnormality as a result of this processing, processing for coping with the abnormality is performed. However, when the power storage device 100 is in the sleep state, the external device 150 is also in the sleep state and the power consumption of the external device 150 is small. Therefore, there is a small possibility that overdischarge and an abnormal increase in the temperature of the cell occur in the power storage device 100.

In addition, the MCU 120 performs processing for monitoring the state of the C terminal 115. Then, the processing proceeds to step S103.

It is determined by the MCU 120 in step S103 whether the state of the C terminal 115 changes. In this example, it is determined whether the state of the C terminal 115 is changed from high to low. When the state of the C terminal 115 does not change, the processing returns to step S102. When the state of the C terminal 115 changes, the processing proceeds to step S104.

In step S104, the MCU 120 which has detected the change of the state of the C terminal 115 changes its state to the active state. Then, the processing proceeds to step S105.

In step S105, the MCU 120 of which the state is changed to the active state turns on the discharge control switch 145a. Accordingly, the power of the power storage unit 103 is supplied to the load 152. The processing proceeds to step S101. As a result of the determination in step S101, the processing proceeds to step S106.

In step S106, the MCU 120 performs processing according to the active state. For example, the MCU 120 performs the processing for monitoring the current flowing in the power storage unit 103, the voltage of each cell, and the temperature of the cell and processing for adjusting a cell balance. Certainly, when it is determined that power storage device 100 has an abnormality as a result of this processing, processing for coping with the abnormality is performed. The processing according to the active state includes the processing for turning on the discharge control switch 145a in step S105. When charging processing (control to the charge control switch 144a) is performed, the charging processing is included in the processing according to the active state. Then, the processing proceeds to step S107.

It is determined by the MCU 120 in step S107 whether the state of the C terminal 115 changes. In this example, it is determined whether the state of the C terminal 115 changes from low to high. When the state of the C terminal 115 does not change, the processing returns to step S106. When the state of the C terminal 115 changes, the processing proceeds to step S108.

In step S108, the MCU 120 which has detected the change of the state of the C terminal 115 changes its state to the sleep state. The processing proceeds to step S109.

In step S109, the MCU 120 of which the state has been changed to the sleep state turns off the charge control switch 144a and the discharge control switch 145a. Accordingly, the supply of the power of the power storage unit 103 to the load 152 is stopped. The processing proceeds to step S101. As a result of the determination in step S101, the processing proceeds to step S102, and the MCU 120 performs the processing according to the sleep state. The processing according to the sleep state includes the processing for turning off the discharge control switch 145a in step S109. Also, when the charge is performed, processing for stopping the charge (processing for turning off the charge control switch 144a) is included in the processing according to the sleep state.

Figure 5:
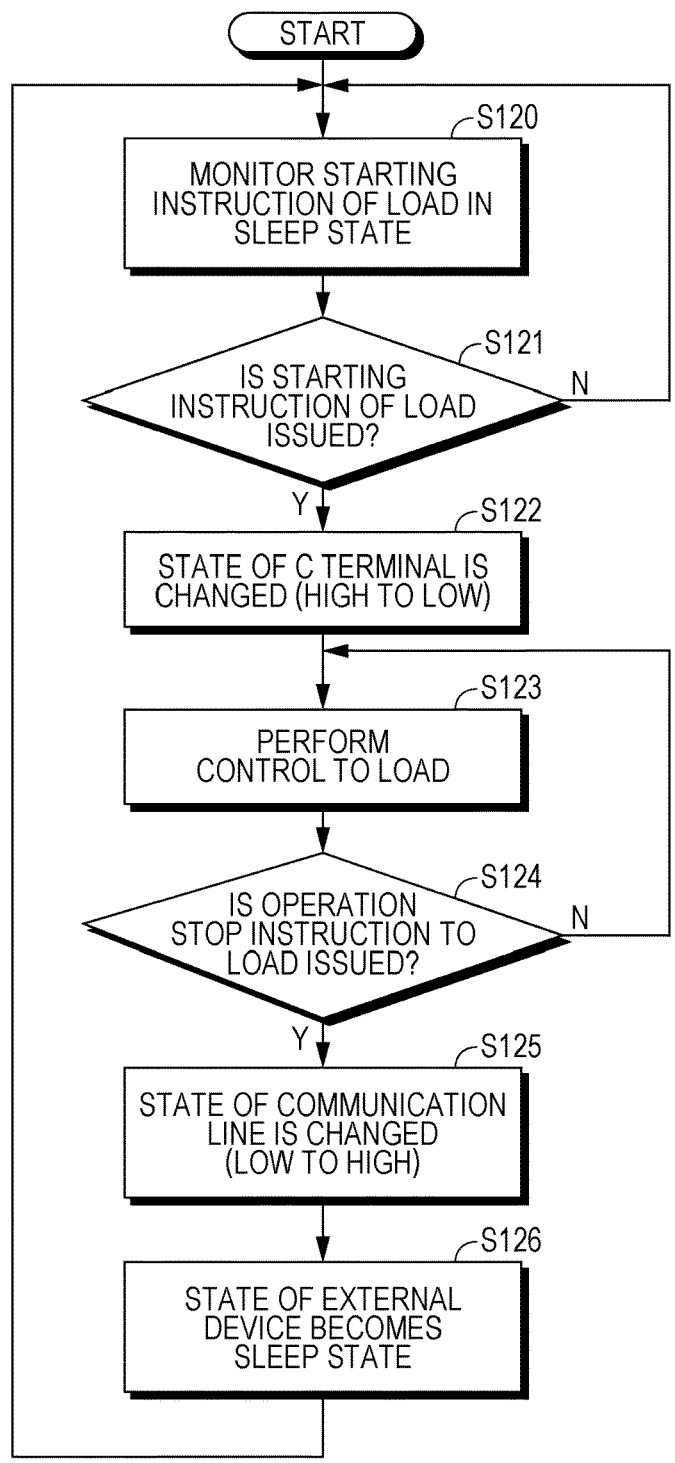
FIG. 5 is a flowchart of an exemplary flow of processing to be performed by a controller of an external device to be connected to the power storage device according to the first embodiment.

FIG. 5 is a flowchart of an exemplary flow of processing in the external device 150. Here, the description will be made while it is assumed that the initial state of the external device 150 be the sleep state.

In step S120, the external controller 151 performs the processing according to the sleep state. In this example, the external controller 151 monitors whether a starting instruction to the load 152 is issued. Then, the processing proceeds to step S121.

It is determined in step S121 whether the starting instruction to the load 152 is issued. When the starting instruction of the load 152 is not issued, the processing returns to step S120, and the determination in step S120 is repeated. When the starting instruction to the load 152 is issued, the processing proceeds to step S122.

In step S122, the external controller 151 changes its state to the active state and lowers the state of the C terminal 163, for example, from high to low. Accordingly, the state of the C terminal 115 of the power storage device 100 is changed from high to low, and the power of the power storage unit 103 is supplied to the load 152 via the power lines PL105 and PL106. The processing proceeds to step S123.

In step S123, the external controller 151 performs various control relative to the load 152. Then, the processing proceeds to step S124.

It is determined by the external controller 151 in step S124 whether the operation stop instruction to the load is issued. When the operation stop instruction to the load is not issued, the processing returns to step S123. When the operation stop instruction to the load is issued, the processing proceeds to step S125.

In step S125, the external controller 151 stops the operation of the load. After that, the external controller 151 raises the state of the C terminal 163, for example, from low to high. Accordingly, the state of the C terminal 115 of the power storage device 100 is changed from low to high, and the supply of the power of the power storage unit 103 to the load 152 is stopped. Then, the processing proceeds to step S126.

In step S126, the external controller 151 changes its state from the active state to the sleep state. Then, the processing returns to step S120. Since the power is supplied to the external controller 151 via the S terminal 162, the external controller 151 can continue to operate.

2. Second Embodiment

Structure of Power Storage Device

Figure 6:
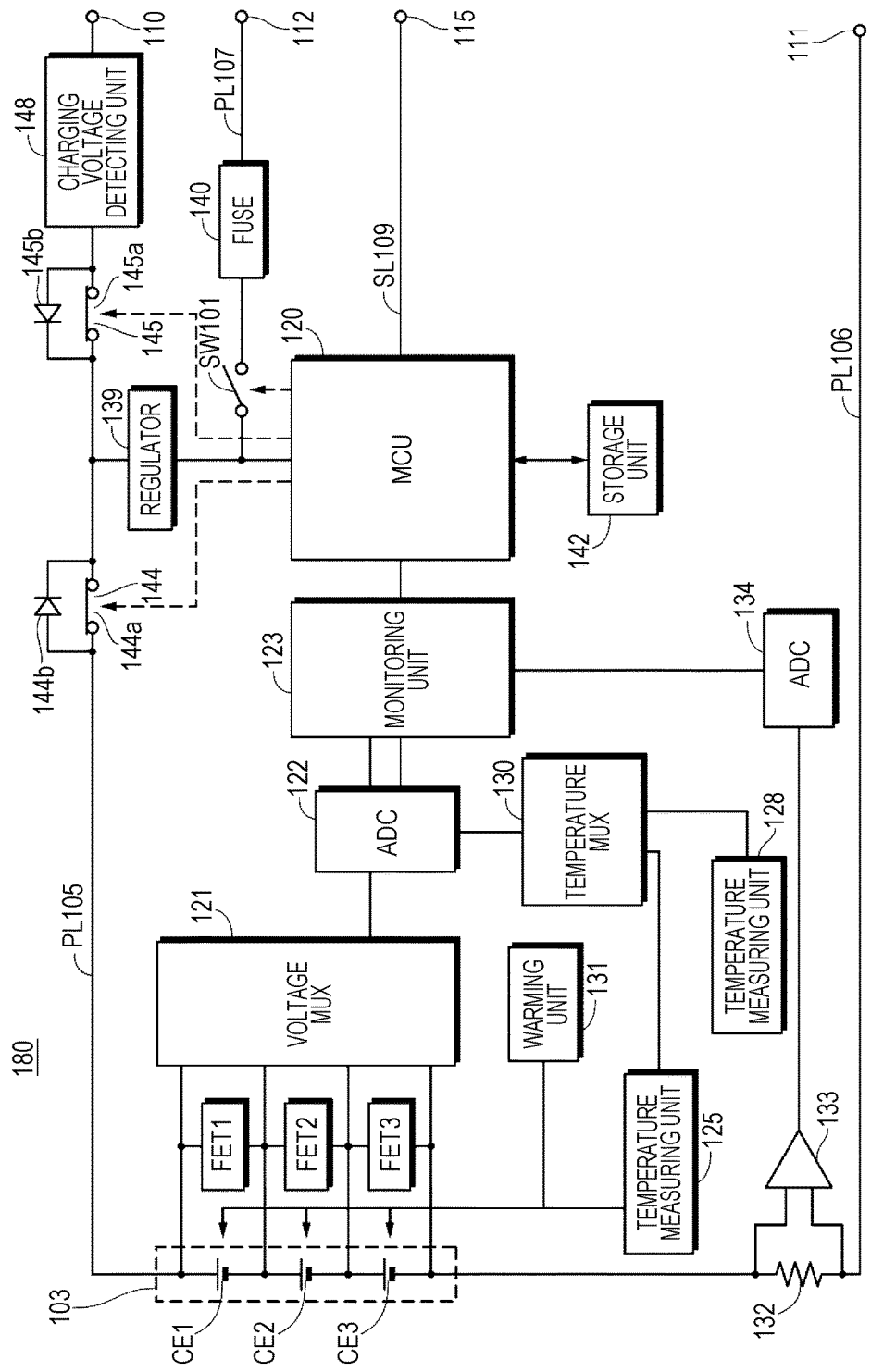
FIG. 6 is a block diagram of an exemplary structure of a power storage device according to a second embodiment.

Next, a second embodiment will be described. In FIG. 6, an exemplary structure of a power storage device 180 according to the second embodiment is illustrated. The same or corresponding components are denoted with the same reference signs in the power storage device 180, and overlapped description will be omitted.

In the power storage device 180, a charging voltage detecting unit 148 is provided between a positive electrode terminal 110 and a discharging controller 145 in a power line PL105. For example, the charging voltage detecting unit 148 is formed of a comparator and can compare a reference voltage and a voltage of the positive electrode terminal 110. The charging voltage detecting unit 148 outputs the comparison result to the MCU 120. The MCU 120 can detect whether the charge is performed according to the comparison result supplied from the charging voltage detecting unit 148.

A switch SW101 is provided at a previous stage of a fuse 140 in a power line PL107 of the power storage device 180. The switch SW101 may be provided at a post stage of the fuse 140. For example, MCU 120 controls on/off of the switch SW101. When the switch SW101 is turned off, supply of power (second power) to an external controller 151 is stopped.

[Operation of Power Storage Device]

An exemplary operation of the power storage device 180 will be described. There is a case where a charging device, in addition to an external device having a load, is connected to the power storage device 180. An exemplary operation of the power storage device 180 in a case where the charging device is connected will be described.

The charging device connected to the power storage device 180 makes a C terminal 115 and a negative electrode terminal 111 be short-circuited and applies a charging voltage to the positive electrode terminal 110. The C terminal 115 and the negative electrode terminal 111 are short-circuited so that the state of the C terminal 115 becomes low, and the state of the MCU 120 is changed to the active state. In addition, the charging voltage detecting unit 148 detects the charging voltage, and the result is supplied to the MCU 120. That is, the MCU 120 can detect whether the charge is performed to the power storage device 180 according to the change of the state of the C terminal 115 and a notification indicating whether the charging voltage exists from the charging voltage detecting unit 148.

When the power storage device 180 is charged, the MCU 120 performs processing corresponding to the charge. The MCU 120 strictly performs processing for monitoring the voltage of the cell to prevent overcharge, processing for monitoring the temperature of each cell, and processing for monitoring an amount of a current.

It is not necessary that the C terminal 115 and the negative electrode terminal 111 be short-circuited at the time of the charge. For example, when the charging voltage detecting unit 148 has detected the charging voltage, the charging voltage detecting unit 148 may generate a control signal to change the sleep state of the MCU 120 to the active state. The state of the MCU 120 may be changed to the active state by supplying the control signal to the MCU 120.

It goes without saying that the power storage device 180 can supply the power to the external device having the load similarly to the power storage device 100.

Figure 7:
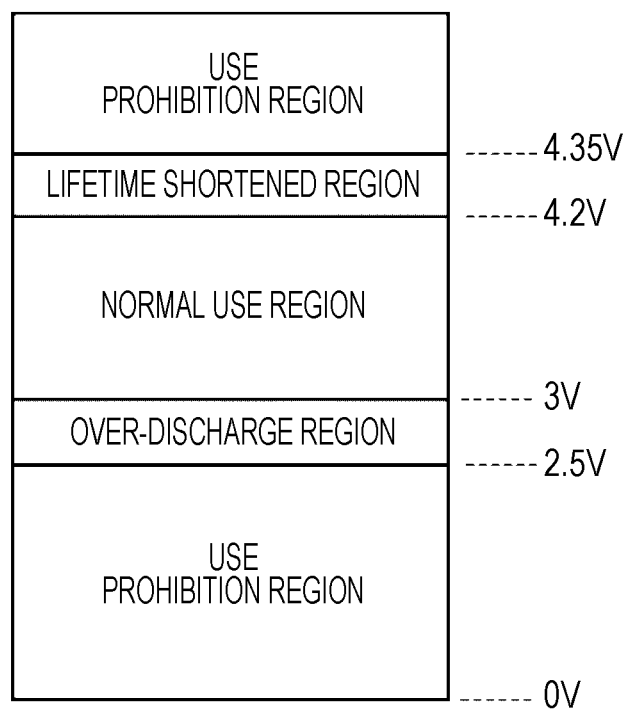
FIG. 7 is a diagram to describe an exemplary use region of a cell of a lithium ion secondary battery.

In a lithium ion secondary battery which is an exemplary cell, a use region to safely use it is set. An exemplary use region of the lithium ion secondary battery is illustrated in FIG. 7. When the voltage of the cell of the lithium ion secondary battery is larger than, for example, 4.35 V, the use of the cell is prohibited. In addition, when the voltage of the cell is larger than 4.2 V, a lifetime of the cell is shortened. Therefore, it is desirable that the cell be used within a range smaller than 4.2 V.

On the other hand, when the voltage of the cell is smaller than, for example, 2.5 V, the use of the cell is prohibited. In addition, when the voltage of the cell is smaller than 3.0 V, the cell is in an over-discharge state. Therefore, it is desirable that the cell be used within a range larger than 3.0V. That is, in a case of the lithium ion secondary battery, it is desirable to use it within a range where the voltage of the cell is larger than 3.0 V and smaller than 4.2 V. Certainly, these values are different according to a kind of the electric battery.

Here, a case will be considered where the power storage device 180 in the active state supplies the power to the load (for example, the above-mentioned load 152 of the external device 150). When the power supply is continued, the remaining capacity of the power storage unit 103 is lowered, and it is possible that the voltage of the cell reaches an over-discharge region and a use prohibition region. Therefore, the power storage device 180 according to the second embodiment operates according to the state of the C terminal 115. However, when the voltage of the cell is smaller than a predetermined voltage, the power storage device 180 performs processing according to the voltage of the cell regardless of the state of the C terminal 115.

[Flow of Processing]

Figure 8:
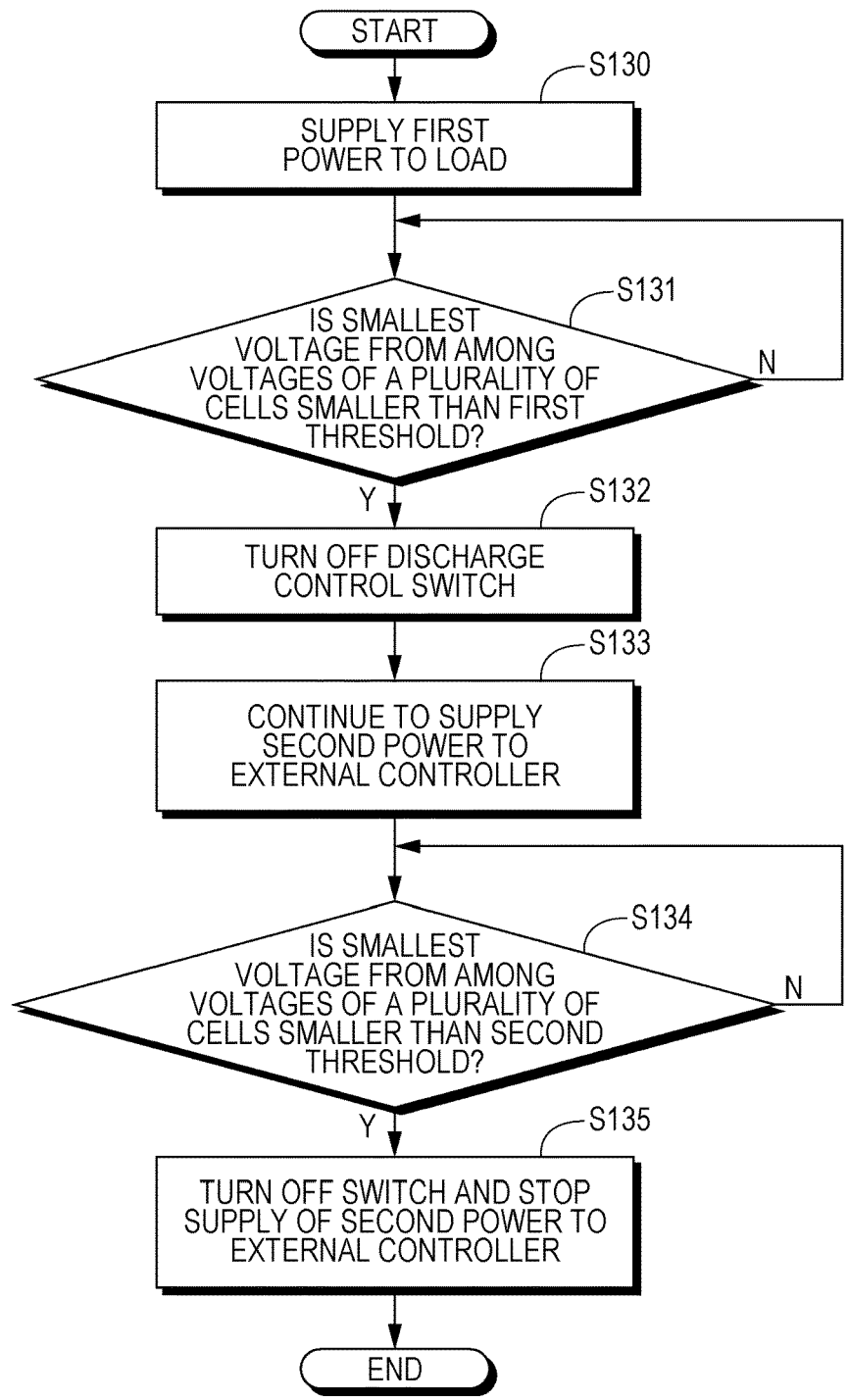
FIG. 8 is a flowchart of an exemplary flow of processing to be performed by a controller of the power storage device according to the second embodiment.

FIG. 8 is a flowchart of an exemplary flow of processing in the power storage device 180. In step S130, the power storage device 180 in the active state supplies the power of the power storage unit 103 (first power) to the load 152 of the external device 150. Then, the processing proceeds to step S131.

In step S131, the MCU 120 obtains the voltage of each cell. For example, the voltage of each cell is periodically obtained. The MCU 120 determines whether the smallest voltage from among the voltages of the three cells (appropriately, referred to as "smallest voltage value") is smaller than a first threshold. For example, the first threshold is set to 3.0 V in which the cell reaches the over-discharge region. When the smallest voltage value is larger than the first threshold, the processing of the determination in step S131 is repeated. When the smallest voltage value is smaller than 3.0 V, the processing proceeds to step S132.

In step S132, the MCU 120 turns off the discharge control switch 145a regardless of the state of the C terminal 115. Accordingly, the power supply to the load 152 is stopped. However, in this case, it is desirable that the MCU 120 previously notify the external controller 151 that the power supply to the load 152 is stopped. Then, the processing proceeds to step S133.

In step S133, the power output via the S terminal 112 continues to be supplied to the external controller 151. That is, the supply of the first power to the load 152 is stopped. However, the supply of the second power to the external controller 151 is continued.

For example, the MCU 120 notifies the external controller 151 of a reduction in the capacity of the power storage unit 103 via the communication. The external controller 151 which has received the notification informs the user of the reduction in the capacity of the power storage unit 103 by a voice, a display, and the like and urges to charge. As described above, since the power supply to the external controller 151 is continued, the external controller 151 can perform the processing for informing the user of the reduction in the capacity of the power storage unit 103 and the like. Then, the processing proceeds to step S134.

It is determined in step S134 whether the smallest voltage value is smaller than a second threshold. For example, the second threshold is set to 2.5 V in which the cell reaches the use prohibition region. When the smallest voltage value is larger than the second threshold, the processing of the determination in step S134 is repeated. When the smallest voltage value is smaller than 3.0 V, the processing proceeds to step S135.

In step S135, the MCU 120 turns off the switch SW101 and stops the supply of the second power to the external controller 151. Accordingly, the use of the cell in the use prohibition region can be prevented, and the cell can be protected.

In the above-mentioned example, the second threshold has been set to 2.5 V in which the cell reaches the use prohibition region. However, the second threshold may be set to a voltage slightly higher than 2.5 V (for example, 2.6 V). Accordingly, the voltage of the cell is prevented from reaching the use prohibition region.

For example, when the smallest voltage value is smaller than the first threshold and larger than the second threshold, there is a case where the charging device is connected to the power storage device 180. When the charging device is connected, the charging processing is performed as interruption processing.

Figure 9:
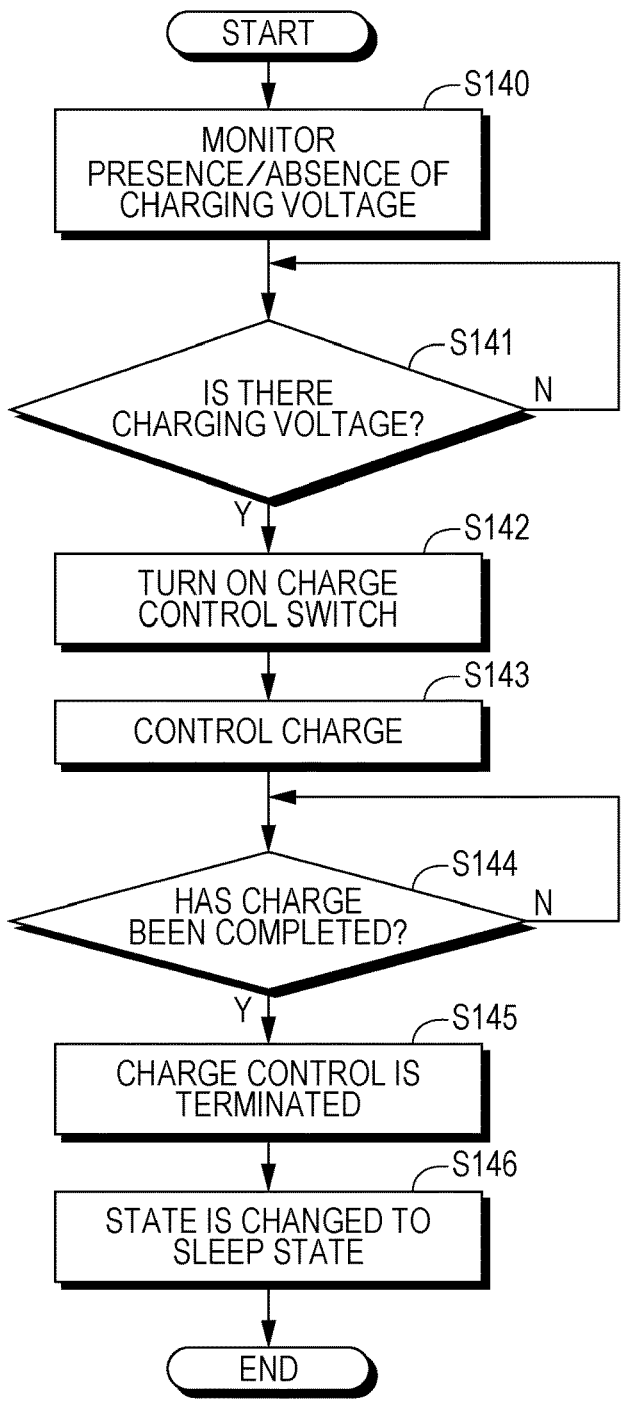
FIG. 9 is a flowchart of an exemplary flow of interruption processing to be performed by the controller of the power storage device according to the second embodiment.

FIG. 9 is a flowchart of an exemplary flow of the charging processing. In step S140, the presence/absence of the charging voltage is monitored. That is, when the smallest voltage value is smaller than the first threshold, the MCU 120 monitors the notification from the charging voltage detecting unit 148 and determines whether the charging voltage is present. Then, the processing proceeds to step S141.

In step S141, the charging voltage detecting unit 148 determines whether the charging voltage is present. When the charging voltage is not present, the processing returns to step S141, and the determination in step S141 is repeated. When the charging voltage is present, the processing proceeds to step S142.

In step S142, the charging voltage detecting unit 148 notifies the MCU 120 that the charging voltage has been detected. The MCU 120 performs the interruption processing according to this notification. That is, the MCU 120 turns on the charge control switch 144a. Accordingly, the charging device starts to charge the power storage device 180. Then, the processing proceeds to step S143.

In step S143, the MCU 120 controls the charge. Well-known processing such as monitoring the voltage and temperature of the cell is performed. The power storage unit 103 is charged, for example, by using a constant voltage constant current (CCCV) system. Then, the processing proceeds to step S144.

It is determined in step S144 whether the charge has been completed. For example, the MCU 120 determines whether the charge has been completed according to whether the largest voltage from among the voltages of the three cells reaches 4.2 V. When the largest voltage from among the voltages of the three cells does not reach 4.2 V, it is determined that the charge is not completed. The determination in step S144 is repeated. When the largest voltage from among the voltages of the three cells has reached 4.2 V, it is determined that the charge has been completed, and the processing proceeds to step S145.

In step S145, the MCU 120 terminates to control the charge. Then, the processing proceeds to step S146. In step S146, the MCU 120 changes its state to the sleep state and performs processing according to the sleep state. According to that the capacity of the power storage unit 103 has been recovered, the supply of the power to the load 152 may be restarted.

When the smallest voltage value of the cell is smaller than 3.0 V, the MCU 120 may calculate a period in which the smallest voltage value reaches 2.5 V based on the power consumption of the external controller 151 and the remaining amount to the use prohibition region (in this example, 0.5 V). The MCU 120 may measure the time by using a timer and the like and may control to turn off the switch SW101 when the measured time becomes longer than the period obtained by the calculation.

[Regarding Modification of Charging Voltage Detecting Unit]

Figure 10:
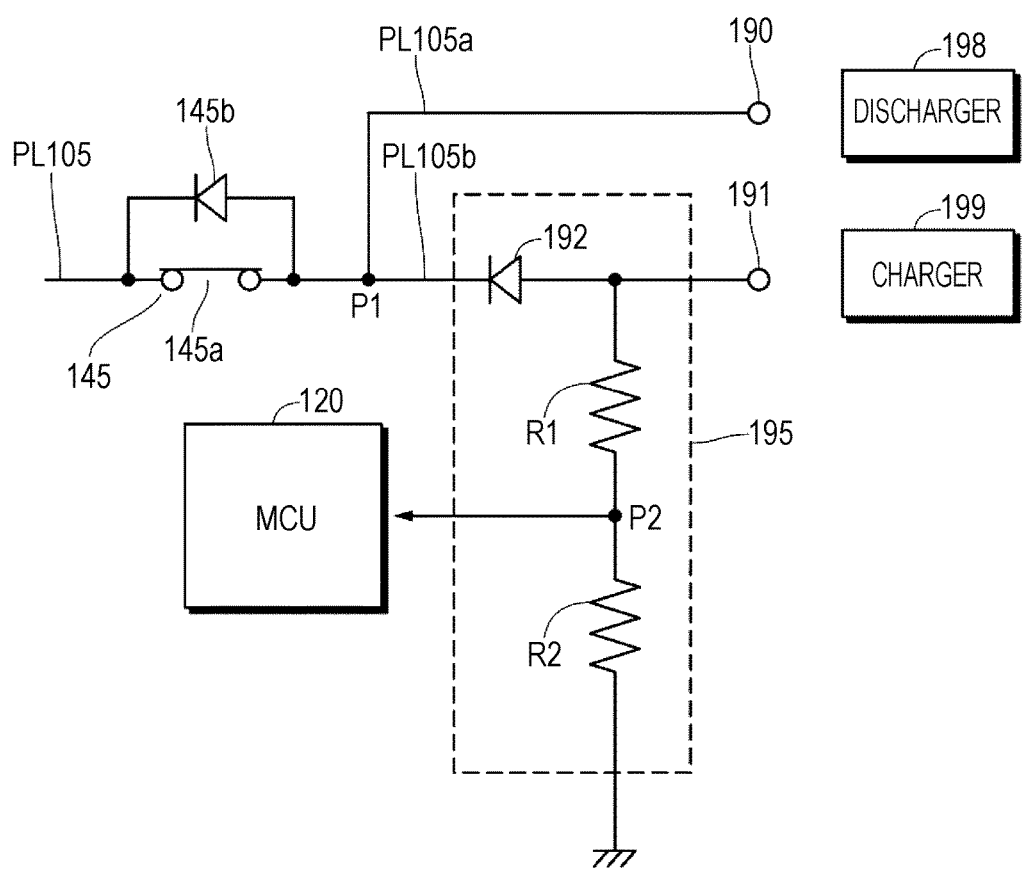
FIG. 10 is a block diagram to describe a modification of a charging voltage detecting unit.

A modification of the charging voltage detecting unit will be described with reference to FIG. 10. Parts relating to the charging voltage detecting unit are mainly illustrated in FIG. 10. The components other than the illustrated ones are similar to those in FIG. 6.

In this modification, the power line PL105 is branched into power lines PL105a and PL105b at a point P1 between the discharging controller 145 and a terminal (positive electrode terminal 110 in the example described in the above-mentioned embodiment). A terminal 190 is connected to the power line PL105a. A terminal 191 is connected to the power line PL105b. A discharger (load) 198 is connected to the terminal 190. A charger 199 is connected to the terminal 191.

A diode 192 is connected to the power line 105b so that the side of the terminal 191 becomes an anode. The diode 192 can prevent that the current flows into the charger 199 connected to the terminal 191.

A resistance dividing circuit including resistances R1 and R2 is connected to the connection midpoint between the terminal 191 and the diode 192. The charging voltage detecting unit 195 includes the resistances R1 and R2 and the diode 192. That is, when the charger 199 is connected to the terminal 191, a predetermined voltage is generated at a connection point (point P2) between the resistances R1 and R2 by the resistance dividing circuit. The predetermined voltage generated at the point P2 is input to the MCU 120. The MCU 120 can detect whether the charge is performed by detecting this voltage.

The MCU 120 can easily determine whether the charging voltage exists by monitoring the voltage between the diode 192 and the charger 199 connected to the terminal 191. The MCU 120 may have an AD conversion function and convert the voltage which is a predetermined analog data generated at the point P2 into a digital data.

3. Application

Figure 11:
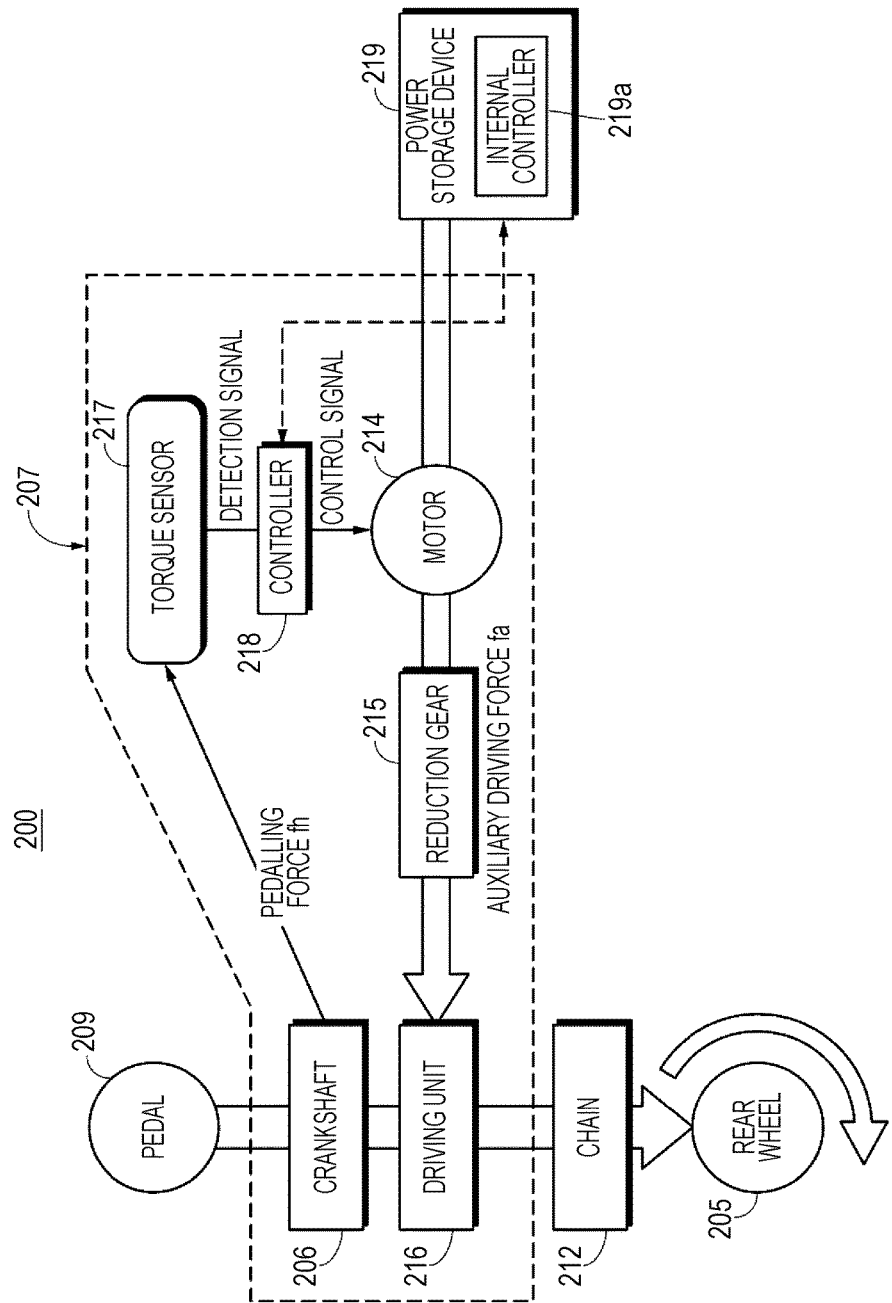
FIG. 11 is a diagram to describe an application of the present disclosure.

An application of the power storage device according to the present disclosure will be described. FIG. 11 is a schematic example of a structure of an electric bicycle when the present disclosure is applied to the electric bicycle.

A electric bicycle 200 has an auxiliary driving unit 207 for supplying an auxiliary driving force fa. The auxiliary driving unit 207 includes a motor 214 which generates the auxiliary driving force fa, a reduction gear 215, a driving unit 216 which outputs the auxiliary driving force fa to a chain 212, a torque sensor 217 which detects a pedalling force fh for acting to a pedal 209, and a controller 218. The torque sensor 217 detects the pedalling force fh from a torque applied to a crankshaft 206. For example, a magnetostrictive sensor is used.

The left and right pedals 209 to which the pedalling force fh is applied are attached to both ends of the crankshaft 206. Also, a rear wheel 205 is interlocked and coupled to the crankshaft 206 via the chain 212, and the pedalling force fh and the auxiliary driving force fa are transmitted to the rear wheel 205 via the chain 212.

The controller 218 is configured by an electric circuit and the like including a microcomputer and includes a storage unit and the like including a non-volatile memory. The controller 218 controls the motor 214 based on a detection signal constantly input from the torque sensor 217. The controller 218 corresponds to the external controller.

The power storage device 219 is removable relative to a vehicle body of the electric bicycle 200. The power storage device 219 supplies the power to the auxiliary driving unit 207 in a state where it is mounted to the electric bicycle 200. The power storage device according to the present disclosure can be applied to the power storage device 219.

That is, the power storage device 219 supplies the first power to the motor 214. In addition, the second power is supplied to the controller 218. The controller 218 of the auxiliary driving unit 207 communicates with a controller (internal controller) 219a of the power storage device 219.

Figure 12:
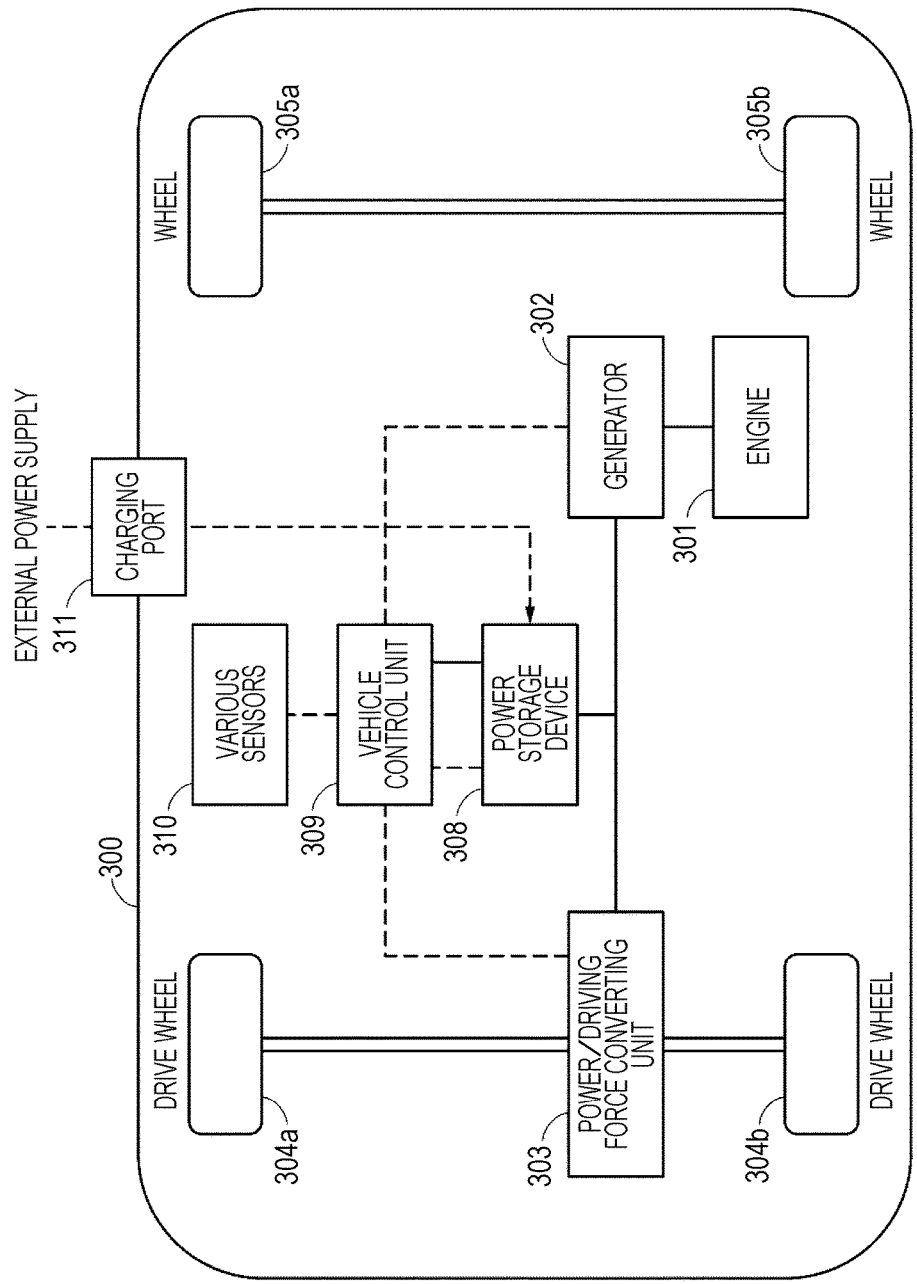
FIG. 12 is a diagram to describe an application of the present disclosure.

FIG. 12 is a schematic example of a structure of an electric automobile when the power storage device according to the present disclosure is applied to a power storage device for the electric automobile. The electric automobile exemplified in FIG. 12 is a hybrid vehicle which employs a series hybrid system. The series hybrid system is an automobile which travels by a power/driving force converting unit by using a power generated by a generator which is driven by an engine or a power which is the above-mentioned power temporarily stored in the electric battery.

A hybrid vehicle 300 includes an engine 301, a generator 302, a power/driving force converting unit 303, drive wheels 304a and 304b, wheels 305a and 305b, a power storage device 308, a vehicle control unit 309, various sensors 310, and a charging port 311 mounted therein.

The hybrid vehicle 300 travels by using the power/driving force converting unit 303 as a power source. A motor is an example of the power/driving force converting unit 303. The power/driving force converting unit 303 is operated by the power of the power storage device 308, and a torque of the power/driving force converting unit 303 is transmitted to the drive wheels 304a and 304b. By using a DC-AC conversion or an inverse conversion (AC-DC conversion) at necessary places, the power/driving force converting unit 303 can be applied when it is either an AC motor and a DC motor.

The various sensors 310 control an engine speed via the vehicle control unit 309 and control an opening of a throttle valve (throttle opening) which is not shown. The various sensors 310 include a speed sensor, an acceleration sensor, an engine speed sensor, and the like.

The torque of the engine 301 is transmitted to the generator 302, and the power generated by the generator 302 by using the torque can be accumulated in the power storage device 308.

When the hybrid vehicle slows down by a braking mechanism which is not shown, a resistance at the time of slowing down is added to the power/driving force converting unit 303 as a torque. Then, a regenerative power generated by the power/driving force converting unit 303 by using the torque is accumulated in the power storage device 308.

By being connected to an external power supply of the hybrid vehicle, the power storage device 308 can receive the power supply from the external power supply via an input port, that is, the charging port 311, and can accumulate the received power.

The power storage device according to the present disclosure can be applied to the power storage device 308. That is, the power storage device 308 supplies the first power to the power/driving force converting unit 303 which is an exemplary load. In addition, the power storage device 308 supplies the second power to the vehicle control unit 309. The vehicle control unit 309 communicates with a controller (not shown) of the power storage device 308.

An information processing device which is not shown may be included. The information processing device performs information processing regarding a vehicle control based on information on the power storage unit of the power storage device 308. As this information processing device, for example, there is an information processing device which displays an electric battery remaining capacity based on information on the remaining capacity of the power storage unit.

A series hybrid vehicle which travels by the motor by using the power generated by the generator driven by the engine and the power which is the above-mentioned power temporarily stored in the electric battery has been used in the above description as an example. However, the present disclosure can be effectively applied to a parallel hybrid vehicle. The parallel hybrid vehicle uses three system, i.e., traveling by the engine, traveling by the motor, and traveling by the engine and the motor, by appropriately switching them while having both outputs of the engine and the motor as a driving force. In addition, the present disclosure can be effectively applied to a so-called electric vehicle which travels by the drive by using the driving motor without using the engine.

A device to which the present disclosure can be applied is not limited to the exemplified electric bicycle and an electric bicycle. The power storage device according to the present disclosure can be applied to an electric vehicle including an electric wheelchair and the like and various electric devices.

4. Modification

The embodiments of the present disclosure have been specifically described above. However, the present disclosure is not limited to the above-mentioned embodiments and can be variously modified based on the technical idea of the present disclosure.

The components exemplified in the embodiments can be replaced to those having the similar functions. For example, the current detecting resistor may include a coulomb counter. The MCU of the power storage device may monitor the current by reading a value of the coulomb counter. In this case, a period in which the MCU reads the coulomb counter in the sleep state can be longer than a period in which the MCU reads the coulomb counter in the active state. The operation of the coulomb counter itself may be performed in the sleep state, and then, the power consumption may be reduced.

The secondary battery included in the power storage unit is not limited to the lithium ion secondary battery, and other secondary battery can be applied.

In addition, the present disclosure can be realized as a method, a program, and a system including a plurality of devices without being limited to the device. The program may be provided to a user via a network or a mobile memory such as an optical disk and a semiconductor memory.

The components and processing in the embodiments and the modification may be appropriately combined with each other within a range where a technical inconsistency does not occur. The order of the processing in the exemplified flow of the processing can be appropriately changed within a range where a technical inconsistency does not occur.

The present disclosure can be applied to a so-called cloud system in which the exemplified processing is distribute and performed by a plurality of devices. The present disclosure can be realized as a system in which the processing exemplified in the embodiments and the modification is performed and a device in which at least a part of the exemplified processing is performed.

The present disclosure can have a structure below.

(1)

A power storage device including:

a power storage unit configured to include one or a plurality of cells;

a first controller configured to perform control relating to the power storage unit;

a first power line configured to supply a first power to be output from the power storage unit to a load;

a second power line configured to supply a second power smaller than the first power to a second controller included in an external device; and a communication line configured to be used by the first and second controllers to communicate with each other.

(2)

The power storage device according to (1), wherein the first controller changes from a first state to a second state according to a change of a state of the communication line.

(3)

The power storage device according to (2), wherein the first controller performs at least processing to supply the first power to the load according to the change from the first state to the second state.

(4)

The power storage device according to (2) or (3), wherein power consumption of processing performed by the first controller in the first state is smaller than that of processing performed by the first controller in the second state.

(5)

The power storage device according to any one of (1) to (4), including:

a power conversion unit configured to form the second power by converting the first power and be connected to the second power line.

(6)

The power storage device according to any one of (1) to (5), wherein the first controller stops supplying the first power to the load regardless of the state of the communication line when a voltage of the power storage unit falls below a first threshold and stops supplying the second power to the second controller when the voltage of the power storage unit falls below a second threshold smaller than the first threshold.

(7)

The power storage device according to (6), including:

a switch configured to be connected to the second power line, wherein the first controller stops supplying the second power to the second controller by turning off the switch when the voltage of the power storage unit falls below the second threshold.

(8)

The power storage device according to (6) or (7), including:

a detector configured to detect a charging voltage, wherein the first controller performs control to charge when the detector detects the charging voltage.

(9)

The power storage device according to any one of (1) to (8), wherein the first power line includes a positive power line and a negative power line, a positive side of the power storage unit of the positive power line is connected to a first switching element for charge control and a second switching element for discharge control, and the first controller and the second power line are connected to a connection point between the first and second switching elements.

(10)

The power storage device according to any one of (1) to (9), wherein the cell is configured of a lithium ion secondary battery cell.

(11)

A power storage system including:

a first device; and a second device, wherein the first device includes a power storage unit which includes one or a plurality of cells, a first controller which performs control relating to the power storage unit, a first power line which supplies a first power to be output from the power storage unit to a load, a second power line which supplies a second power smaller than the first power to a second controller, and a communication line which is used by the first and second controllers to communicate with each other, and the second device includes the load to which the first power is supplied via the first power line and the second controller to which the second power is supplied via the second power line and which communicates with the first controller via the communication line.

(12)

The power storage system according to (11), wherein the first controller changes from a first state to a second state according to a change of a state of the communication line, and the second controller changes the state of the communication line according to detection of a predetermined input.

(13) An electric vehicle including:

a power storage device configured to include a power storage unit which includes one or a plurality of cells, a first controller which performs control relating to the power storage unit, a first power line which supplies a first power to be output from the power storage unit to a load, a second power line which supplies a second power smaller than the first power to a second controller included in an external device, and a communication line which is used by the first and second controllers to communicate with each other.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

| | |
|---|---|
| 100 | power storage device |
| 103 | power storage unit |
| 120 | MCU |
| 140 | fuse |
| 144a | charge control switch |
| 145a | discharge control switch |
| 150 | external device |
| 151 | external controller |
| 152 | load |
| CE | cell |
| PL105 | (positive) power line |
| PL106 | (negative) power line |
| PL107 | power line |
| SL109 | communication line |

The invention claimed is:

1. A power storage device including:
a power storage unit configured to include one or a plurality of cells;
a first controller configured to perform control relating to the power storage unit;
a first power line configured to supply a first power to be output from the power storage unit to a load of an external device;
a second power line configured to supply a second power smaller than the first power to a second controller included in the external device; and
a communication line configured to be used by the first and second controllers to communicate with each other, wherein the first controller stops supplying the first power to the load when a voltage of the power storage unit falls below a first threshold and wherein the first controller stops supplying the second power to the second controller when the voltage of the power storage unit falls below a second threshold smaller than the first threshold.

2. The power storage device according to claim 1, wherein the first controller changes from a first state to a second state according to a change of a state of the communication line.

3. The power storage device according to claim 2, wherein the first controller performs at least processing to supply the first power to the load according to the change from the first state to the second state.

4. The power storage device according to claim 3, wherein power consumption of processing performed by the first controller in the first state is smaller than that of processing performed by the first controller in the second state.

5. The power storage device according to claim 1, comprising:
a power conversion unit configured to form the second power by converting the first power and be connected to the second power line.

6. The power storage device according to claim 1, comprising:
a switch configured to be connected to the second power line, wherein
the first controller stops supplying the second power to the second controller by turning off the switch when the voltage of the power storage unit falls below the second threshold.

7. The power storage device according to claim 1, comprising:
a detector configured to detect a charging voltage, wherein
the first controller performs control to charge when the detector detects the charging voltage.

8. The power storage device according to claim 1, wherein
the first power line includes a positive power line and a negative power line,
a positive side of the power storage unit of the positive power line is connected to a first switching element for charge control and a second switching element for discharge control, and
the first controller and the second power line are connected to a connection point between the first and second switching elements.

9. The power storage device according to claim 1, wherein the cell is configured of a lithium ion secondary battery cell.

10. A power storage system including:
a first device; and
a second device, wherein
the first device includes a power storage unit which includes one or a plurality of cells, a first controller which performs control relating to the power storage unit, a first power line which supplies a first power to be output from the power storage unit to a load of an external device, a second power line which supplies a second power smaller than the first power to a second controller in the external device, and a communication line which is used by the first and second controllers to communicate with each other, and
the second device includes the load to which the first power is supplied via the first power line and the second controller to which the second power is supplied via the second power line and which communicates with the first controller via the communication line,
wherein the first controller stops supplying the first power to the load when a voltage of the power storage unit falls below a first threshold and wherein the first controller stops supplying the second power to the second controller when the voltage of the power storage unit falls below a second threshold smaller than the first threshold.

11. The power storage system according to claim 10, wherein
the first controller changes from a first state to a second state according to a change of a state of the communication line, and the second controller changes the state of the communication line according to detection of a predetermined input.

12. An electric vehicle including:
a power storage device configured to include a power storage unit which includes one or a plurality of cells, a first controller which performs control relating to the power storage unit, a first power line which supplies a first power to be output from the power storage unit to a load of an external device, a second power line which supplies a second power smaller than the first power to a second controller included in the external device, and a communication line which is used by the first and second controllers to communicate with each other,
wherein the first controller stops supplying the first power to the load when a voltage of the power storage unit falls below a first threshold and wherein the first controller stops supplying the second power to the second controller when the voltage of the power storage unit falls below a second threshold smaller than the first threshold.

* * * * *